(12) United States Patent
Lin et al.

(10) Patent No.: US 7,030,431 B2
(45) Date of Patent: Apr. 18, 2006

(54) METAL GATE WITH COMPOSITE FILM STACK

(75) Inventors: Shian-Jyh Lin, Chia-Yi Hsien (TW); Chung-Yuan Lee, Tao-Yuan (TW); Yu-Chang Lin, Yun-Lin Hsien (TW)

(73) Assignee: Nanya Technology Corp., Tao-Yuan Hsien (TW)

( * ) Notice: Subject to any disclaimer, the term of this patent is extended or adjusted under 35 U.S.C. 154(b) by 231 days.

(21) Appl. No.: 10/708,708

(22) Filed: Mar. 19, 2004

(65) Prior Publication Data

US 2005/0205942 A1    Sep. 22, 2005

(51) Int. Cl.
| H01L 27/148 | (2006.01) |
| H01L 29/94 | (2006.01) |
| H01L 29/70 | (2006.01) |
| H01L 29/768 | (2006.01) |
| H01L 31/113 | (2006.01) |

(52) U.S. Cl. .................. 257/250; 257/288; 257/412; 257/588

(58) Field of Classification Search ............... None
See application file for complete search history.

(56) References Cited

U.S. PATENT DOCUMENTS

| 5,888,588 | A | * | 3/1999 | Nagabushnam et al. . 427/248.1 |
| 6,197,702 | B1 | * | 3/2001 | Tanabe et al. ............... 438/773 |
| 6,245,605 | B1 | * | 6/2001 | Hwang et al. ............... 438/216 |
| 6,277,722 | B1 | * | 8/2001 | Lee et al. ..................... 438/592 |
| 6,323,115 | B1 | * | 11/2001 | Tanabe et al. ............... 438/592 |
| 6,333,547 | B1 | * | 12/2001 | Tanaka et al. ............... 257/649 |
| 6,346,467 | B1 | * | 2/2002 | Chang et al. ................ 438/594 |
| 6,358,790 | B1 | * | 3/2002 | Fritzinger et al. .......... 438/243 |
| 6,720,604 | B1 | * | 4/2004 | Fritzinger et al. .......... 257/306 |
| 6,764,961 | B1 | * | 7/2004 | Ku et al. ..................... 438/770 |
| 6,790,723 | B1 | * | 9/2004 | Tanaka et al. ............... 438/243 |
| 6,960,515 | B1 | * | 11/2005 | Cho et al. .................... 438/592 |
| 2002/0024119 | A1 | * | 2/2002 | Tanaka et al. ............... 257/649 |
| 2002/0084192 | A1 | * | 7/2002 | Maydan et al. ............. 205/170 |
| 2002/0098670 | A1 | * | 7/2002 | Ashihara et al. ............ 438/586 |
| 2002/0111025 | A1 | * | 8/2002 | Weybright et al. .......... 438/689 |
| 2002/0127888 | A1 | * | 9/2002 | Cho et al. .................... 438/900 |
| 2002/0137284 | A1 | * | 9/2002 | Chang et al. ................ 438/257 |
| 2002/0137321 | A1 | * | 9/2002 | Ku et al. ..................... 438/592 |
| 2003/0045068 | A1 | * | 3/2003 | Gutsche et al. ............. 438/386 |
| 2004/0014330 | A1 | * | 1/2004 | Ku et al. ..................... 438/769 |
| 2004/0106274 | A1 | * | 6/2004 | Dokumaci et al. .......... 438/585 |
| 2004/0106279 | A1 | * | 6/2004 | Anderson et al. ........... 438/672 |
| 2004/0132272 | A1 | * | 7/2004 | Ku et al. ..................... 438/585 |
| 2005/0184397 | A1 | * | 8/2005 | Gates et al. ................. 257/774 |

* cited by examiner

Primary Examiner—David E. Graybill
(74) Attorney, Agent, or Firm—Winston Hsu (57) ABSTRACT

A novel metal gate structure includes a gate oxide layer formed on a surface of a silicon substrate, a doped silicon layer stacked on the gate oxide layer, a CVD ultra-thin titanium nitride film deposited on the doped silicon layer, a tungsten nitride layer stacked on the CVD ultra-thin titanium nitride film, a tungsten layer stacked on the tungsten nitride layer, and a nitride cap layer stacked on the tungsten layer. A liquid phase deposition (LPD) oxide spacer is formed on each sidewall of the metal gate stack. A silicon nitride spacer is formed on the LPD oxide spacer. The thickness of the CVD ultra-thin titanium nitride film is between 10 and 100 angstroms.

14 Claims, 9 Drawing Sheets

METAL GATE WITH COMPOSITE FILM STACK

BACKGROUND OF INVENTION

1. Field of the Invention

The present invention relates to a metal gate structure, and more particularly, to a gate structure with composite film stack suited for mass production.

2. Description of the Prior Art

As deep sub-micron geometries such as line width, contact area, and junction depth of integrated circuits continue to shrink, RC delay contact and resistance become major factors that adversely affect devices performance. To cope with these problems, chipmakers have used polycide materials to replace conventional polysilicon gate and used silicide at the contact junctions to reduce contact resistance. Typically, silicide thin film is made by thermally treating a metal thin film. The metal thin film may be deposited with evaporation or sputtering. With furnace annealing or RTP annealing in high-purity nitrogen or argon environment, the metal thin film reacts with silicon surface to form silicide. Typical gate silicide materials include titanium silicide, tungsten silicide, cobalt silicide, nickel silicide, molybdenum silicide, platinum silicide, and so on.

Other approaches using non-silicide metal gate structure, for example, stack gates with tungsten metal layer or tantalum metal layer, have also been developed. The fabrication processes of the non-silicide metal gates are similar to the fabrication processes of polycide gates. After consecutively deposition of polysilicon and metals, lithography and gate etching processes are carried out. In some cases, after the definition of gate structure, selective tungsten deposition is performed to form an additional tungsten thin film on the gate and on the source/drain areas. However, it is disadvantageous that the way of forming additional tungsten film over gate/source/drain may lead to bridging between the gate and the source/drain of the transistors, thus reducing the production yield. In still some other cases, the metal gate structure may be pure metal layer without polysilicon. The advantages include very low resistance and prevention of carrier depletion. The later is especially important to deep sub-micron devices, because when carrier depletion takes places in the polysilicon layer of a gate, an equivalent depletion capacitor forms in series with the gate oxide capacitor, leading to a reduced capacitance of gate capacitor and debilitated driving ability of the transistor.

In light of the above, it has become a mainstream to use low-resistance metal gate for avoiding RC delay as the line width of devices shrinks to nano-scale. Accordingly, there is a strong need to provide a metal gate structure with composite film stack that is suited for mass production.

SUMMARY OF INVENTION

It is the primary object of the present invention to provide a metal gate structure with composite metal stack that is suited for mass production, particularly suited for sub 0.1-micon gate fabrication.

According to the claimed invention, a metal gate structure is provided. A gate oxide layer is formed on a silicon substrate. A doped silicon layer is stacked on the gate oxide layer. An ultra-thin titanium nitride barrier layer is deposited on the doped silicon layer. A tungsten nitride layer is stacked on the ultra-thin titanium nitride barrier layer. A tungsten layer is stacked on the tungsten nitride layer. A silicon nitride cap layer is stacked on the tungsten layer. The metal gate structure further comprises a liquid phase oxide spacer formed on sidewall of the metal gate structure for protecting the tungsten nitride layer and the tungsten layer from oxidation. A silicon nitride spacer is formed on the liquid phase oxide spacer. The ultra-thin titanium nitride barrier layer is deposited using chemical vapor deposition (CVD) method or atomic layer deposition (ALD) and has a thickness of about 10~100 angstroms.

According to one aspect of the present invention, a metal gate structure includes a gate oxide layer formed on a silicon substrate; a doped silicon layer stacked on the gate oxide layer; an metal barrier stack deposited on the doped silicon layer; a tungsten nitride layer stacked on the metal barrier stack; a tungsten layer stacked on the tungsten nitride layer; and a silicon nitride cap layer stacked on the tungsten layer. The ultra-thin metal barrier stack is deposited using atomic layer deposition (ALD).

According to one preferred embodiment of the present invention, the metal barrier stack is a dual-layer structure comprising an upper metal layer and a lower metal layer. The upper metal layer is made of a material selected from the group consisting of cobalt nitride, titanium nitride, nickel nitride and tantalum nitride. The lower metal layer is made of a material selected from the group consisting of cobalt, titanium nickel and tantalum. According to another preferred embodiment of the present invention, the metal barrier stack is a triple-layer structure comprising a first metal layer, a second metal layer on said first metal layer, and a third metal layer on said second metal layer. The first metal layer is made of a material selected from the group consisting of cobalt, titanium, nickel and tantalum. The second metal layer is made of a material selected from the group consisting of cobalt nitride, titanium nitride, nickel nitride and tantalum nitride. The third metal layer is made of a material selected from the group consisting of cobalt, titanium, nickel and tantalum.

Fabrication process for making the metal gate structure with composite film stack in accordance with the preferred embodiment of this invention is provided as follows:

1. Polysilicon deposition.
2. CVD or ALD deposition of titanium nitride.
3. PVD deposition of tungsten nitride.
4. PVD or CVD deposition of tungsten layer.
5. CVD deposition of silicon nitride cap layer.
6. Metal gate structure lithography and etching.
7. Liquid phase oxide spacer forming.
8. Silicon nitride spacer forming (optional).

Other objects, advantages, and novel features of the claimed invention will become more clearly and readily apparent from the following detailed description when taken in conjunction with the accompanying drawings.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

Figure 1:
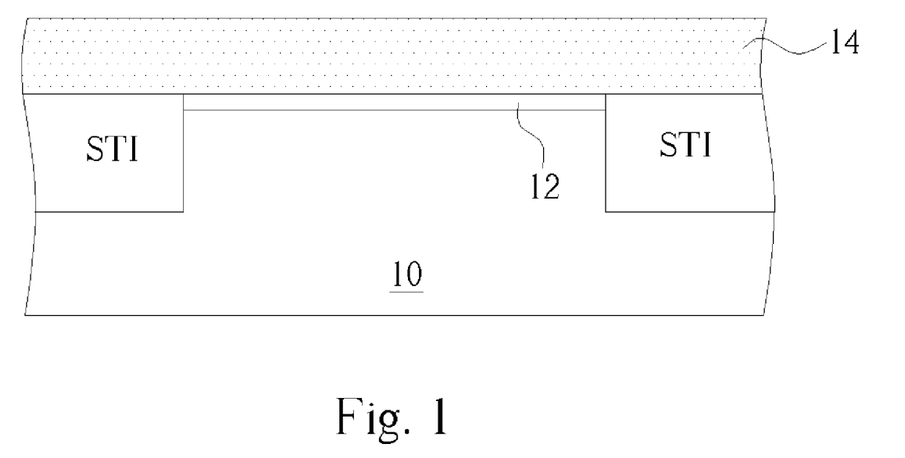
FIG. 1 to FIG. 7 are schematic cross-sectional diagrams illustrating the fabrication processes for making an advanced metal gate structure with composite metal stack in accordance with one preferred embodiment of this invention.

Please refer to FIG. 1 to FIG. 7. FIG. 1 to FIG. 7 are schematic cross-sectional diagrams illustrating the fabrication processes for making a novel metal gate structure with composite metal stack in accordance with one preferred embodiment of this invention. As shown in FIG. 1, a thin gate oxide film 12 is formed on a semiconductor substrate 10 using conventional thermal oxidation processes. A doped silicon layer 14 is then deposited over the semiconductor substrate 10. According to this preferred embodiment, the semiconductor substrate 10 is a silicon substrate. The doped silicon layer 14 is deposited using low pressure chemical vapor deposition (LPCVD) method and has a thickness of about 1000 angstroms, but not limited thereto. The doped silicon layer 14 may be doped amorphous silicon layer or doped polysilicon layer.

Figure 2:
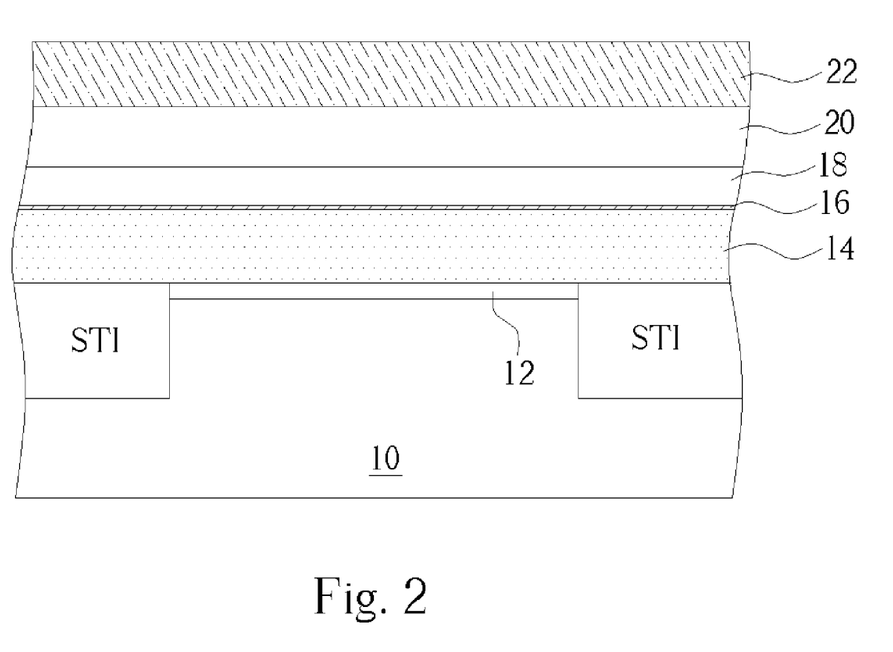

As shown in FIG. 2, an ultra thin metal barrier 16 is then deposited over the doped silicon layer 14 using CVD method and has a thickness of about 10~100 angstroms. In other embodiments, alternatively, Atomic Layer Deposition (ALD), Metal Organic Chemical Vapor Deposition (MOCVD) or Molecular Beam Epitaxial may be employed to deposit uniformly laminar ultra thin metal barrier 16 such as titanium nitride ultra thin film. The present invention has an advantage over the prior art sputtering methods since the ultra thin metal barrier 16 is CVD deposited and thus has uniformly laminar structure. The prior art sputtering methods are hard to control since the sputtering time period is too short. Therefore, the present invention is suited for mass production. Thereafter, a tungsten nitride layer 18, a tungsten layer 20 and a silicon nitride layer 22 are sequentially deposited over the ultra thin metal barrier 16. The thickness of the tungsten nitride layer 18 is about 30~350 angstroms. The thickness of the tungsten layer 20 is about 200~1000 angstroms. The thickness of the silicon nitride layer 22 is about 500~5000 angstroms. The tungsten nitride layer 18 and tungsten layer 20 may be deposited using physical vapor deposition (PVD) methods, but not limited thereto. For example, the tungsten layer 20 may be deposited using CVD methods.

Figure 8:
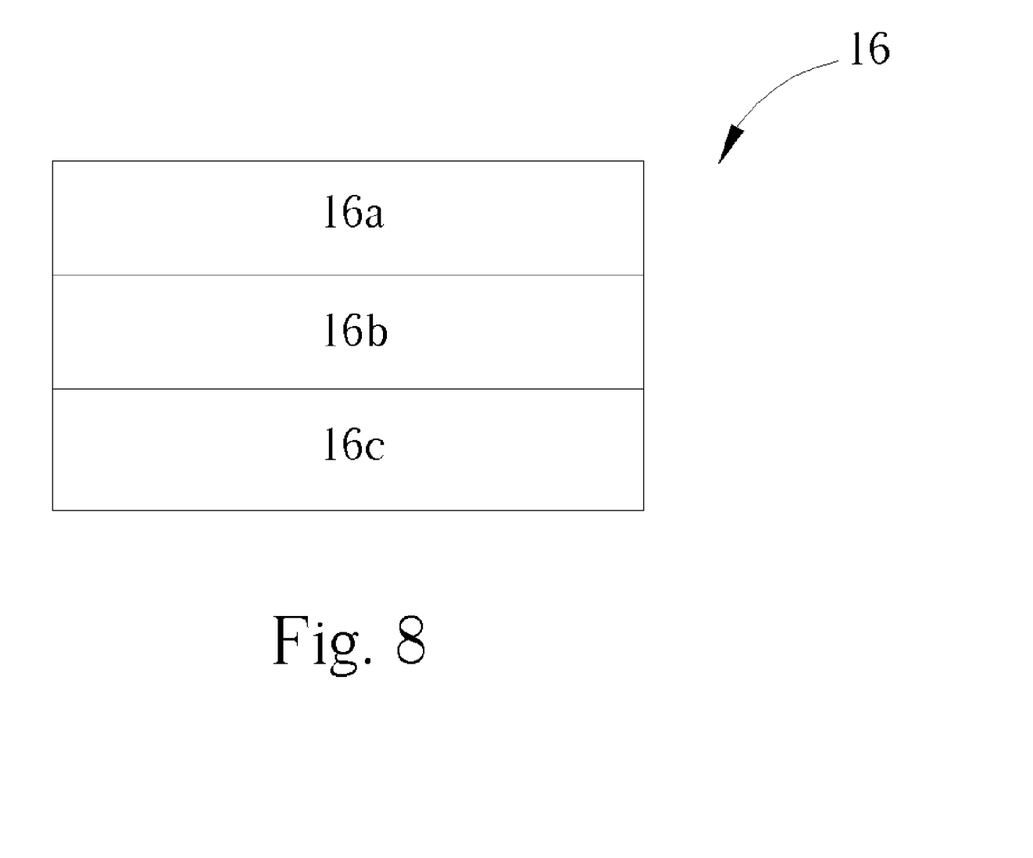
FIG. 8 illustrates a metal gate structure having a triple-layer barrier in accordance to another preferred embodiment of this invention.

Please refer to FIG. 8. FIG. 8 illustrates a metal gate structure in accordance to another preferred embodiment of this invention. As shown in FIG. 8, the metal barrier layer 16 may be triple layer stack including metal layer 16a, metal layer 16b and metal layer 16c, wherein the metal layer 16a may be cobalt, titanium, nickel, or tantalum, the metal layer 16b may be cobalt nitride, titanium nitride, nickel nitride, or tantalum nitride, and the metal layer 16c may be cobalt, titanium, nickel, or tantalum. Preferably, triple layer stack with titanium/titanium nitride/titanium stack is used as the barrier. The titanium layer bordering the tungsten nitride layer can prevent spiking of tungsten in the subsequent thermal processes.

Figure 9:
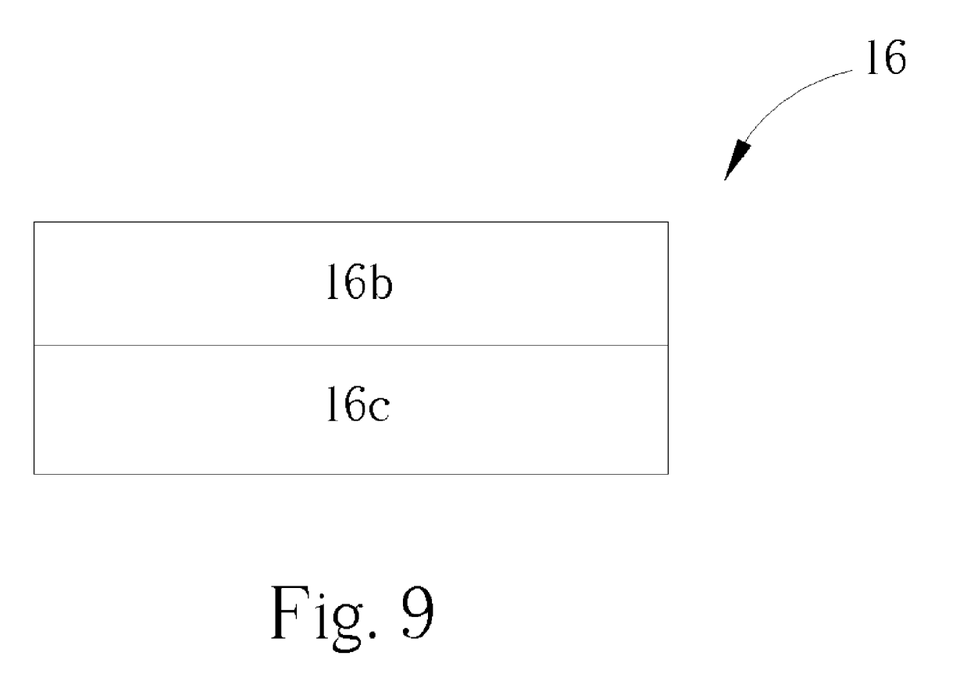
FIG. 9 illustrates a metal gate structure having a dual-layer barrier in accordance to another preferred embodiment of this invention.

Please refer to FIG. 9. FIG. 9 illustrates a metal gate structure in accordance to still another preferred embodiment of this invention. As shown in FIG. 9, the metal barrier layer 16 may be dual-layer structure including metal layer 16b metal layer 16c, wherein the metal layer 16b may be cobalt nitride, titanium nitride, nickel nitride, or tantalum nitride, and the metal layer 16c may be cobalt, titanium, nickel, or tantalum.

Figure 3:
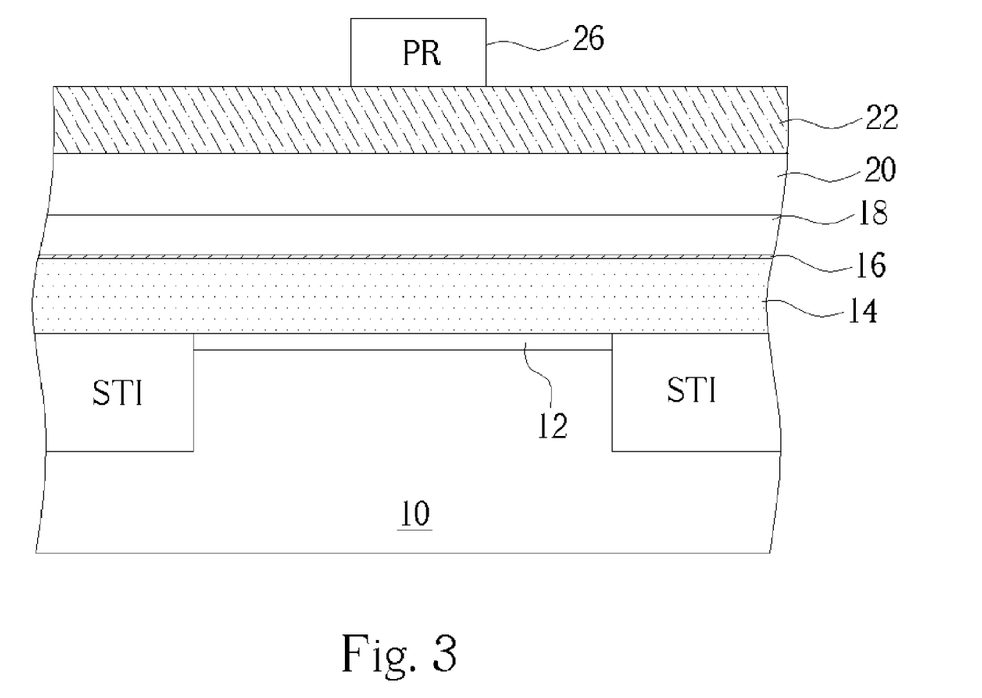
Figure 4:
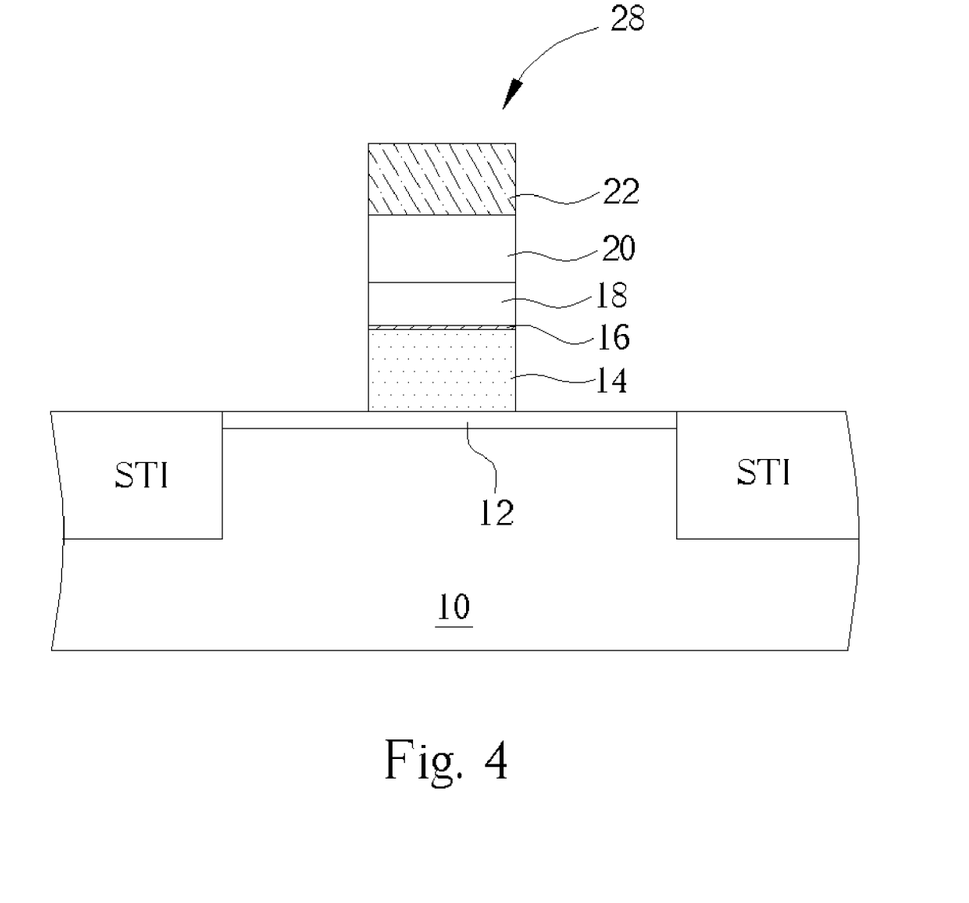

As shown in FIG. 3, a photoresist layer is then formed on the silicon nitride layer 22. A conventional lithographic process is then performed to define a gate pattern 26. According to this preferred embodiment, the critical line width of the gate pattern 26 is about 0.1 microns or below. As shown in FIG. 4, next, using the gate pattern 26 as an etching hard mask, a dry etching is carried out to transfer the gate pattern 26 to the subjacent stack structure, thereby forming a metal gate structure 28. The above-said dry etching may be one-step or multi-step. For example, in a two-step etching case, using the photoresist gate pattern as a hard mask, the silicon nitride layer 22 is etched away. The photoresist gate pattern 26 is then removed. Then, using the patterned silicon nitride layer 22 as a hard mask, a second dry etching is performed to etch the tungsten layer 20, the tungsten nitride layer 18, the ultra-thin barrier layer 16, the doped silicon layer, and the gate oxide layer 12.

Figure 5:
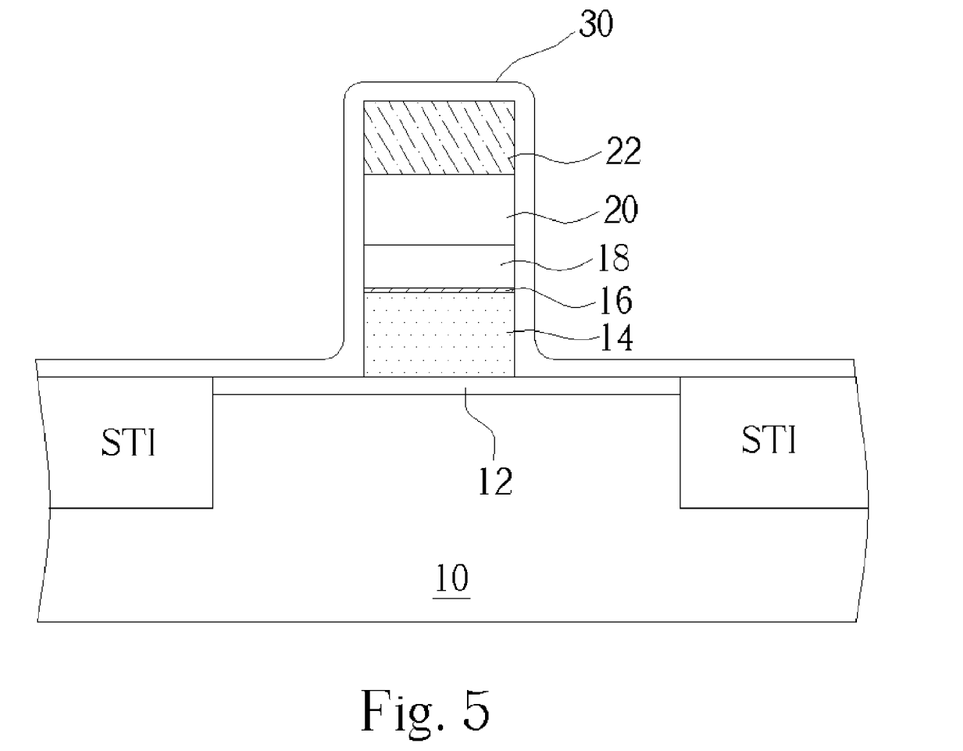
Figure 6:
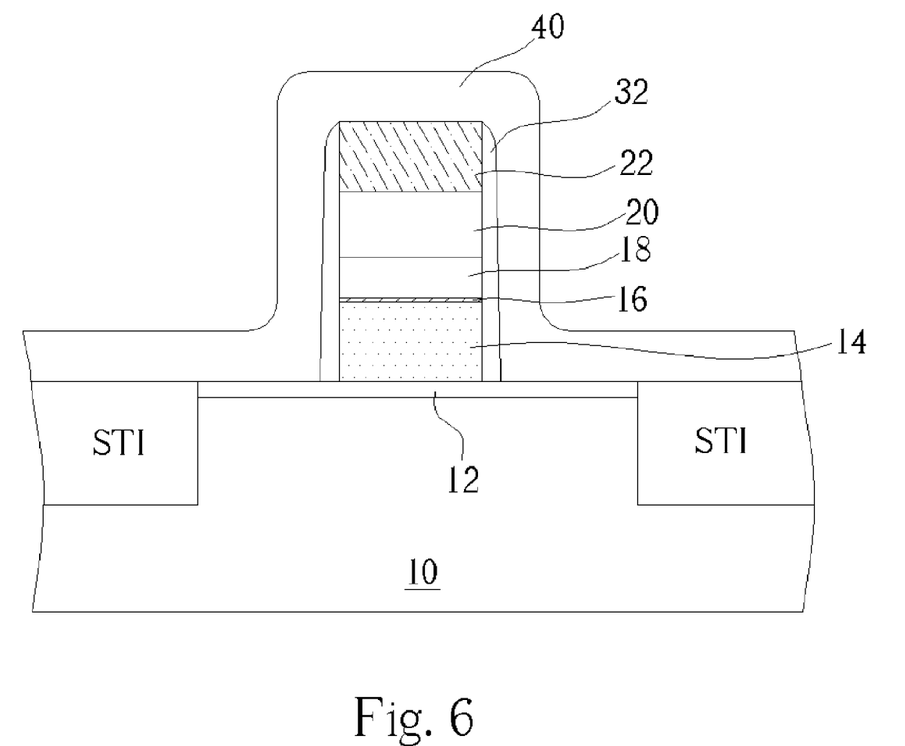

As shown in FIG. 5, a liquid phase oxide deposition process is carried out to deposit a liquid phase oxide film 30 on the surface of the metal gate structure 28. The liquid phase oxide deposition process is carried out at a low temperature of about 25~50° C. The associated reactions of the liquid phase oxide deposition process may be expressed by the following equations:

According to Eq. (2), boric acid ($H_3BO_3$) consumes the fluoric acid (HF) produced in the reaction according to Eq. (1) such that the reaction as set forth in Eq. (1) proceeds toward right-hand side, thereby forming the product: liquid phase oxide film 30. The liquid phase oxide film 30 formed on the surface (top and sidewalls) of the metal gate structure 28 protects the metal layers of the metal gate structure 28 from being oxidized during the subsequent cleaning processes. As shown in FIG. 6, a dry etching process is then carried out to etch the liquid phase oxide film 30, leaving portions of the liquid phase oxide film 30, i.e., liquid phase oxide spacers 32, on sidewalls of the metal gate structure 28. A CVD process is then performed to deposited a silicon nitride layer 40 on exposed metal gate structure 28 and on the liquid phase oxide spacers 32.

Figure 7:
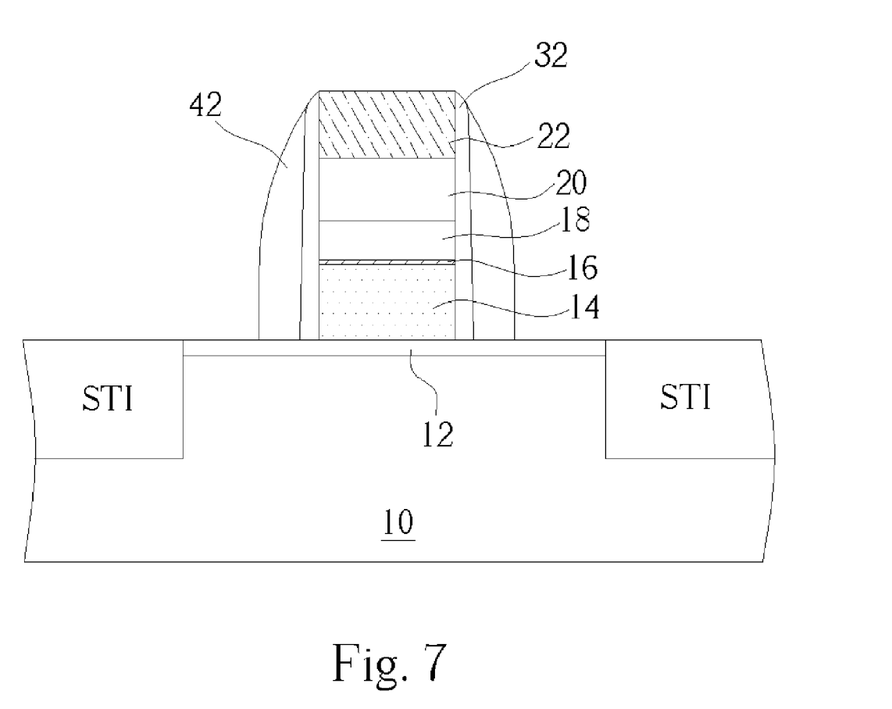

As shown in FIG. 7, an etching back process is carried out to etch the silicon nitride layer 40 to form a silicon nitride spacer 42 on the liquid phase oxide spacers 32.

To sum up, the exemplary fabrication process for making the metal gate structure with composite film stack in accordance with the preferred embodiment of this invention generally includes the following stages:

1. High Temperature Film (HTF) or Furnace Poly Deposition (FPD) polysilicon deposition: about 1000 angstroms.
2. CVD deposition of titanium nitride: 10~100 angstroms.
3. PVD deposition of tungsten nitride: 30~300 angstroms.
4. PVD or CVD deposition of tungsten layer: 200~800 angstroms.
5. CVD deposition of silicon nitride cap layer: 500~2500 angstroms.
6. Metal gate structure lithography and etching.
7. Liquid phase oxide spacer forming.
8. Silicon nitride spacer forming.

Those skilled in the art will readily observe that numerous modifications and alterations of the present invention may be made while retaining the teachings of the invention. Accordingly, the above disclosure should be construed as limited only by the metes and bounds of the appended claims.

What is claimed is:

1. A metal gate structure, comprising:
   a gate oxide layer formed on a silicon substrate;
   a doped silicon layer stacked on said gate oxide layer;
   an ultra-thin titanium nitride barrier layer deposited on said doped silicon layer;
   a tungsten nitride layer stacked on said ultra-thin titanium nitride barrier layer;
   a tungsten layer stacked on said tungsten nitride layer; and
   a silicon nitride cap layer stacked on said tungsten layer.

2. The metal gate structure according to claim 1 further comprising an oxide spacer formed on sidewall of said metal gate structure for protecting said tungsten nitride layer and said tungsten layer from oxidation.

3. The metal gate structure according to claim 2 further comprising a silicon nitride spacer formed on said oxide spacer, and wherein said oxide spacer is liquid phase oxide spacer.

4. The metal gate structure according to claim 1 wherein said ultra-thin titanium nitride barrier layer is deposited using chemical vapor deposition (CVD) method and has a thickness of about 10~100 angstroms.

5. The metal gate structure according to claim 1 wherein said ultra-thin titanium nitride barrier layer is deposited using atomic layer deposition (ALD), metal organic chemical vapor deposition (MOCVD) or Molecular Beam Epitaxial.

6. The metal gate structure according to claim 1 wherein said doped silicon layer is doped polysilicon layer.

7. A metal gate structure, comprising:
   a gate oxide layer formed on a silicon substrate;
   a doped silicon layer stacked on said gate oxide layer;
   an metal barrier stack deposited on said doped silicon layer;
   a tungsten nitride layer stacked on said metal barrier stack;
   a tungsten layer stacked on said tungsten nitride layer; and
   a silicon nitride cap layer stacked on said tungsten layer.

8. The metal gate structure according to claim 7 wherein said metal barrier stack is a triple-layer structure comprising a first metal layer, a second metal layer on said first metal layer, and a third metal layer on said second metal layer.

9. The metal gate structure according to claim 8 wherein said first metal layer is made of a material selected from the group consisting of cobalt, titanium, nickel and tantalum.

10. The metal gate structure according to claim 8 wherein said second metal layer is made of a material selected from the group consisting of cobalt nitride, titanium nitride, nickel nitride and tantalum nitride.

11. The metal gate structure according to claim 8 wherein said third metal layer is made of a material selected from the group consisting of cobalt, titanium, nickel and tantalum.

12. The metal gate structure according to claim 7 wherein said metal barrier stack is a dual-layer structure comprising an upper metal layer and a lower metal layer.

13. The metal gate structure according to claim 12 wherein said upper metal layer is made of a material selected from the group consisting of cobalt nitride, titanium nitride, nickel nitride and tantalum nitride.

14. The metal gate structure according to claim 12 wherein said lower metal layer is made of a material selected from the group consisting of cobalt, titanium nickel and tantalum.

* * * * *